(12) United States Patent
Wagstaff

(10) Patent No.: US 6,545,454 B1
(45) Date of Patent: Apr. 8, 2003

(54) SYSTEM AND METHOD FOR TESTING AN INTEGRATED CIRCUIT DEVICE USING FFT ANALYSIS BASED ON A NON-ITERATIVE FFT COHERENCY ANALYSIS ALGORITHM

(75) Inventor: Ronald D. Wagstaff, Lehigh, PA (US)

(73) Assignee: Agere Systems, Inc., Berkeley Heights, NJ (US)

( * ) Notice: Subject to any disclaimer, the term of this patent is extended or adjusted under 35 U.S.C. 154(b) by 0 days.

(21) Appl. No.: 09/350,645

(22) Filed: Jul. 9, 1999

(51) Int. Cl.[7] .................. G01R 23/16; G01R 13/34; G01R 31/28
(52) U.S. Cl. ................. 324/76.21; 324/76.42; 714/724
(58) Field of Search ................ 714/724, 728, 714/737, 738, 740; 702/108; 324/76.42, 76.24, 76.15, 76.19, 76.21, 76.34

(56) References Cited

U.S. PATENT DOCUMENTS

| | | | | |
|---|---|---|---|---|
| 4,862,073 A | * | 8/1989 | Barrow | 324/76.58 |
| 5,515,300 A | * | 5/1996 | Pierce | 702/190 |
| 5,589,763 A | * | 12/1996 | Burns | 324/76.15 |
| 5,748,672 A | * | 5/1998 | Smith et al. | 375/226 |
| 5,768,155 A | * | 6/1998 | Becker | 702/190 |
| 6,078,281 A | * | 6/2000 | Milkovich et al. | 342/196 |
| 6,177,893 B1 | * | 1/2001 | Velazquez et al. | 341/118 |

OTHER PUBLICATIONS

Bertocco, M.; Narduzzi, C. and Petri, D.; Optimized sinewave test of waveform digitizers by a DFT approach; IEEE Instrumentation and Measurement Technology Conference Proceedings, Quality Measurements: The Indispensable Bridge between Theory and Reality, 1.*

Tsai–Hwa Chen; Discrete fourier transform analysis for harmonic distortion and am/fm modulation in ate testing; International Automatic Testing Conference, 1978, pp: 154–164.*

* cited by examiner

Primary Examiner—Albert Decady
Assistant Examiner—Joseph D. Torres
(74) Attorney, Agent, or Firm—Synnestvedt & Lechner LLP

(57) ABSTRACT

A system tests analog and mixed signal IC devices using an FFT algorithm, supported by a non-iterative Fast Fourier Transform (FFT) coherency analysis algorithm to establish FFT sample-set coherency. A test signal is input into the IC device, and an output signal from the IC device is analyzed using the FFT algorithm. The non-iterative FFT coherency analysis algorithm uses only one "given" value and two approximated values related to a test signal. Based on these given and approximated values, the correct set of all four values required for proper testing of the IC device is determined in a single pass, without the need for multiple iterations.

4 Claims, 6 Drawing Sheets

SYSTEM AND METHOD FOR TESTING AN INTEGRATED CIRCUIT DEVICE USING FFT ANALYSIS BASED ON A NON-ITERATIVE FFT COHERENCY ANALYSIS ALGORITHM

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND OF THE INVENTION

The present invention disclosed herein relates generally to electronic testing systems and methods. More particularly, the present invention relates to a system and method for testing an integrated circuit (IC) device using an FFT algorithm, supported by a non-iterative FFT coherency analysis algorithm which establishes FFT sample-set coherency, to analyze an output signal generated by IC the device in response to an input test signal supplied thereto.

When an integrated circuit (IC) is tested for proper operation, a test signal is typically supplied at its input. The output signal from the IC is then analyzed to determine what effects, if any, the IC had on the input test signal. The analysis of the output signal is performed using a Fast Fourier Transform (FFT) for which a mathematical relationship involving four numbers must fulfill a certain interrelationship, thereby establishing FFT sample-set coherency. These four numbers are as follows: test frequency, sample frequency, the number of samples, and the number of periodic cycles over which the samples were taken.

Currently, a best-guess iterative process is used to determine a "valid" set of four numbers, properly related. That is, one may start with one given and up to three approximated values. The interrelationships of these values are then analyzed. It is very unlikely that the results of the analysis will be satisfactory. Typically, one or more numbers must be changed, and the results re-analyzed. The current methodology of finding proper testing parameters are time consuming and inefficient.

A need therefore exists, for a system and method that overcome the above, as well as other, disadvantages of the conventional IC device testing procedure.

BRIEF SUMMARY OF THE INVENTION

It is an object of the present invention to provide a system and method for testing IC devices.

It is another object of the present invention to provide a system and method for testing IC devices using an FFT algorithm supported by a non-iterative FFT coherency analysis algorithm which establishes FFT sample-set coherency.

It is still another object of the present invention to provide a system and method for testing IC devices using an FFT algorithm supported by a non-iterative FFT coherency analysis algorithm to analyze an output signal generated by the IC device in response to an input test signal supplied thereto.

The above and other objects are achieved by a method for testing an integrated circuit (IC) device using an FFT algorithm, supported by a non-iterative Fast Fourier Transform (FFT) coherency analysis algorithm, which establishes FFT sample-set coherency. According to the inventive method, a test signal of a predetermined test frequency is generated. The test signal is supplied to the IC device. A sample frequency is selected for sampling the test signal which is output from the IC device. A number of samples is then selected from the sampled test signal. A number of periodic cycles over which the samples have been taken is selected such that the predetermined test frequency, sample frequency, number of samples and number of periodic cycles are related to each other by a predetermined relationship.

In accordance with one aspect of the present invention, the number of samples and the number of periodic cycles are relatively prime.

In accordance with another aspect of the present invention, the sample frequency is selected as an approximate value, and the sample frequency is further calculated as an exact value which is a function of the predetermined test frequency, the number of samples and the number of periodic cycles.

BRIEF DESCRIPTION OF THE DRAWINGS

The present invention is illustrated in the figures of the accompanying drawings which are meant to be exemplary and not limiting, in which like reference characters are intended to refer to like or corresponding parts, and in which.

DETAILED DESCRIPTION OF THE PREFERRED EMBODIMENTS

As a general overview, the present invention provides a system and method for testing IC and other analog and mixed signal devices using an FFT algorithm, supported by a non-iterative FFT coherency analysis algorithm to establish FFT sample-set coherency. The present invention ensures that a "sample set" is "coherent". If the sample set, i.e., captured samples, is coherent, a standard mathematical FFT algorithm can be applied for conversion from the time domain into the frequency domain to test the devices. If the sample set is not coherent, the FFT conversion is basically worthless.

In order to be coherent, four values, which are explained in detail below, must be properly inter-correlated. According to the present invention, one "given" value and two approximated values related to a test signal are selected. Based on these given and approximated values, the correct set of four values required for proper testing of the IC device by the FFT algorithm is determined in a single pass, without the need for multiple iterations.

Figure 1:
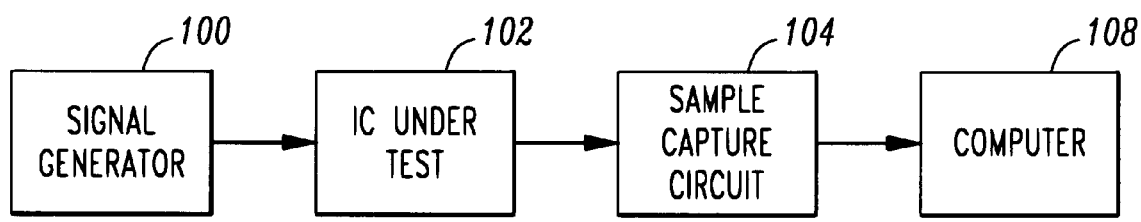
FIG. 1 shows a block diagram of a system for testing an IC device in accordance with the present invention.

One embodiment of the present invention will now be described in detail with reference to the accompanying figures. In particular, FIG. 1 shows a block diagram of a system for testing an IC in accordance with the present invention. A signal generator 100 generates a test signal of a particular frequency and period, such as a sine wave. The test signal is supplied to an IC 102 which is under test. The IC 102 may be an analog or mixed signal device. The test signal output from the IC 102 is provided to a sample capture circuit 104 for sampling the output test signal. The sample capture circuit 104 may contain an analog-to-digital (A/D) converter, or alternatively may collect pre-existing digital samples. The digitized signal is supplied to a computer 108 as binary data for analyzing the results using a program code residing on a storage medium and executable by a programmable controller or microprocessor, for example.

Figure 2:
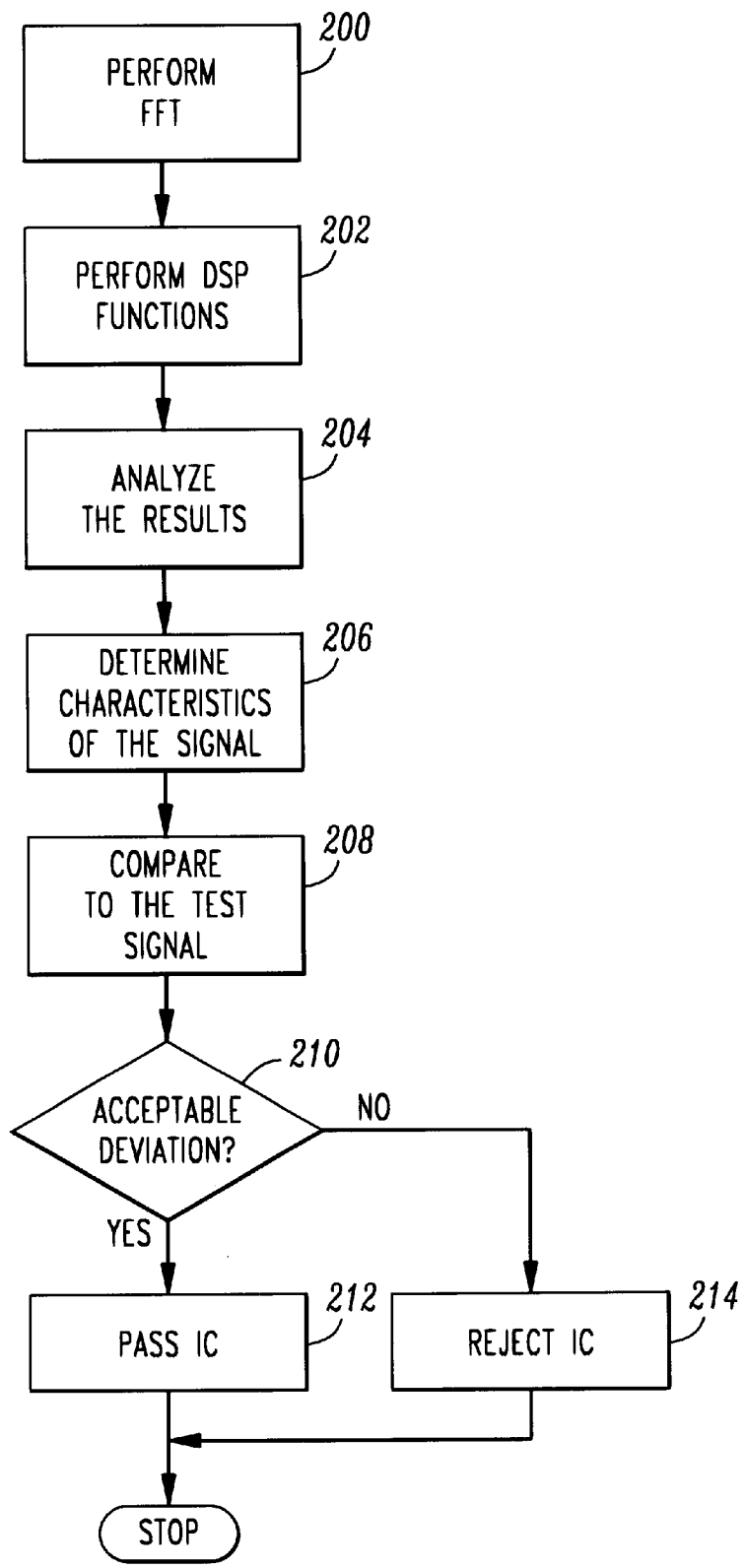
FIG. 2 shows a process flowchart for testing an IC device in accordance with the present invention, resulting upon execution of the program code in the computer 108.

FIG. 2 shows a process flowchart for testing an IC in accordance with the present invention, resulting upon execution of the program code in the computer 108. In step 200, an FFT algorithm is performed on the captured samples. As known to those skilled in the art, an FFT algorithm converts time-domain data to frequency domain. In step 202, DSP functions are run on the frequency-domain data, and in step 204 the results from the DSP functions are analyzed. In step 206, characteristics of the signal passed through the IC 102 are analyzed and compared to the input test signal in step 208. If there is an acceptable deviation from the input test signal parameters as determined in step 210, the IC passes the test in step 212. Otherwise, in step 214, the IC is rejected.

Figure 3A:
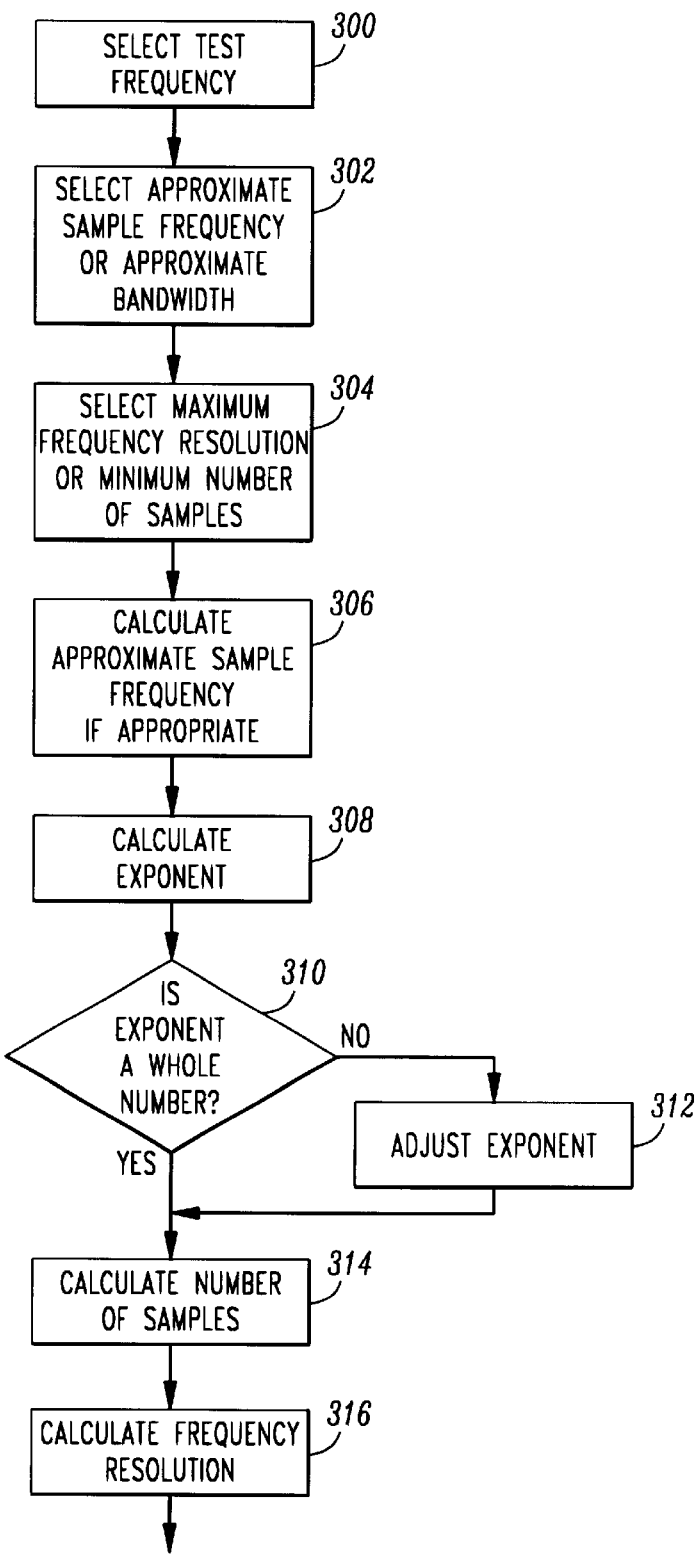
FIGS. 3A and 3B show process flowcharts for calculating four values if a test frequency is selected and a sample frequency and number of samples are approximated.
Figure 3B:
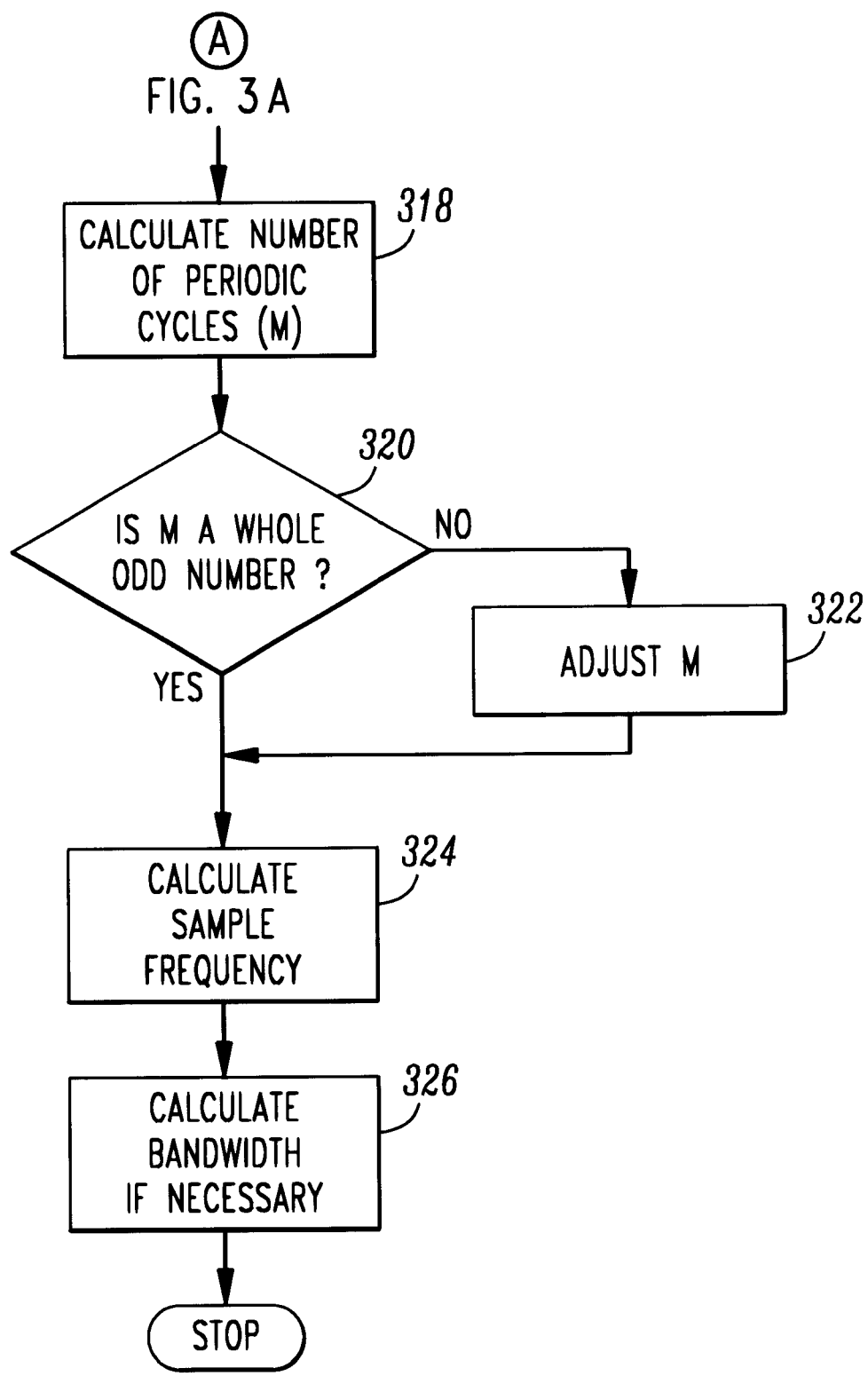
Figure 4A:
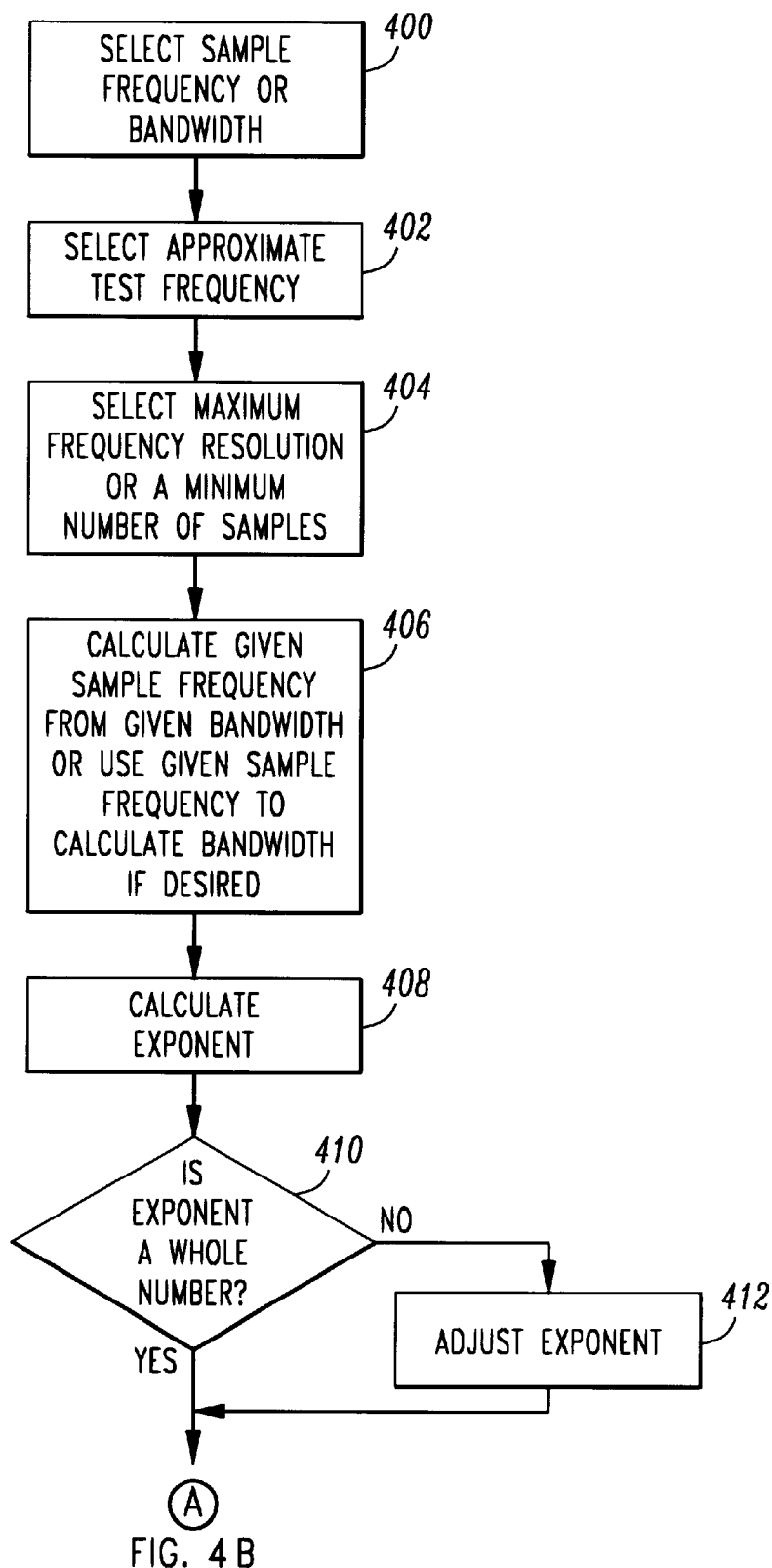
FIGS. 4A and 4B show process flowcharts for calculating four values if a sample frequency or bandwidth is selected and a test frequency and number of samples are approximated.
Figure 4B:
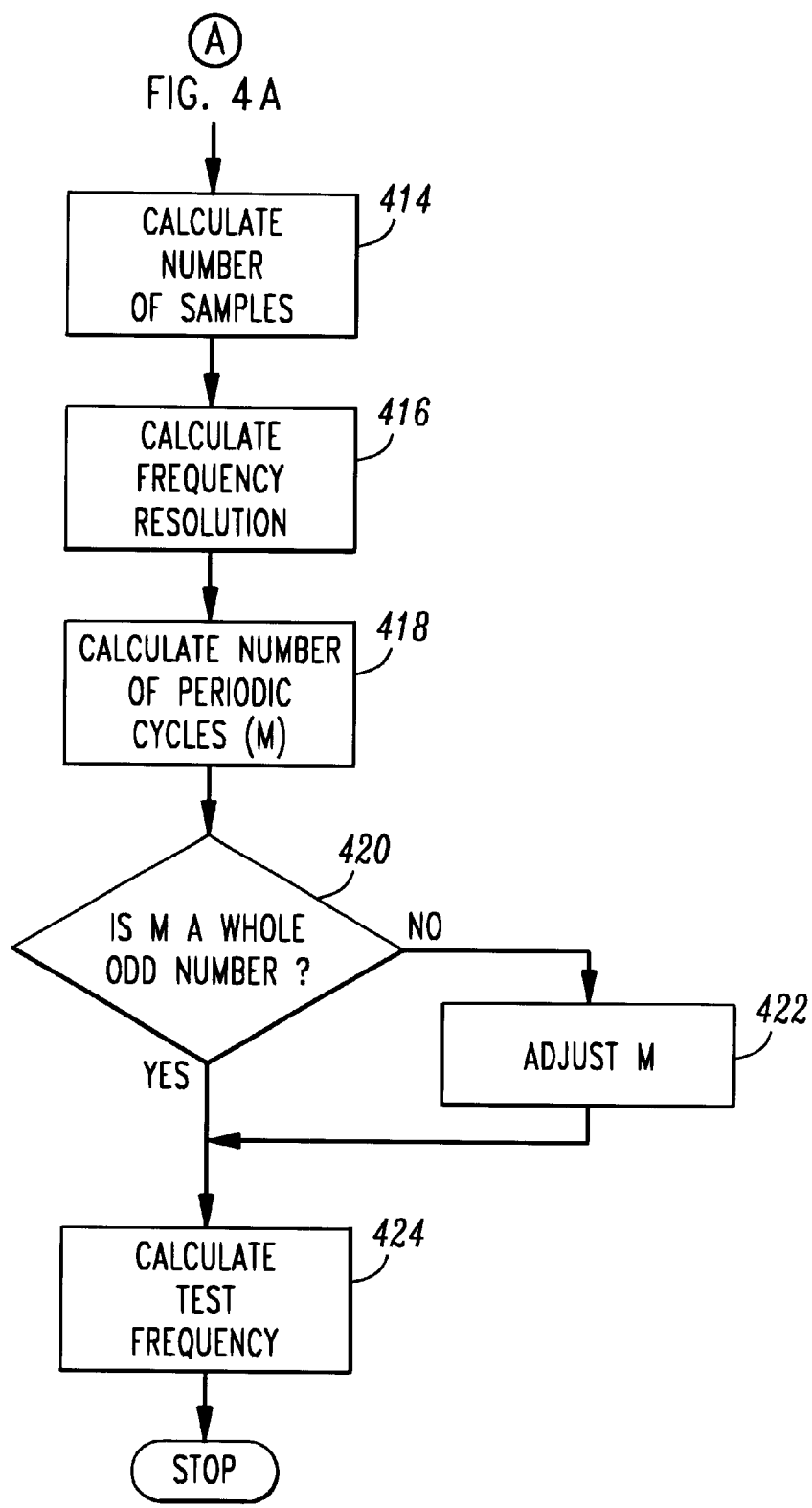

In order for the above operations described with reference to FIG. 2 to be meaningful for testing purposes, certain relationships among four values have to be maintained as described above. The four values related to the testing procedure are test frequency, sample frequency, the number of samples, and the number of periodic cycles over which the samples were taken. According to one aspect of the present invention, the number of samples and the number of cycles should ideally be relatively prime. According to another aspect of the present invention, the number of samples must be a power of 2. According to yet another aspect of the present invention, if one exact value and two approximated values are selected, all four values are arrived at in one pass, without the need to re-calculate one value and then re-adjust other values as in the conventional systems. As a result, the testing procedure may be carried out in less time because no iterations are required. FIGS. 3A and 3B show process flowcharts for calculating all four values if a test frequency is selected and a sample frequency and number of samples are approximated. FIGS. 4A and 4B show process flowcharts for calculating all four values if a sample frequency or bandwidth is selected and a test frequency and number of samples are approximated. The operations of these figures will now be described according to the present invention.

In step 300, a test frequency $f_t$ the input signal is selected. This is one exact or given value in the procedure of the present invention. In step 302, a sample frequency $f_s$ is also selected, and $f_s$ is an approximate value and will be further adjusted, if necessary, to an exact value as described below. Alternatively, an approximate bandwidth BW may be chosen instead of the sample frequency, if desired. In step 304, a maximum frequency resolution max_$f_{res}$ is selected or, alternatively, a minimum number of samples min_N for running the test is selected. In step 306, approximate sample frequency is calculated as $f_s$=BW×2. If the approximate sample frequency is used instead of bandwidth, then $f_s$ is set to $f_s$.

FIG. 3A further shows in step 308 an exponent EXP being calculated. If the maximum frequency resolution max_$f_{res}$ is used, then EXP is calculated as follows:

EXP=log($f_s$/max_$f_{res}$)/log(2.0)

Since min_N=$f_s$/max_$f_{res}$, the value for EXP may be alternatively calculated as follows:

EXP=log(min_N)/log(2.0)

In step 310, it is determined whether the exponent EXP is a whole number. If so, the procedure continues with step 314. Otherwise, EXP is rounded up to the whole number in step 312, and the procedure continues with step 314 where the exact value for the number of samples is calculated as two to the power of the exponent: N=2⌃EXP. In step 316, the exact value for frequency resolution $f_{res}$ is calculated as $f_s$/N. Continuing with step 318 in FIG. 3B, the number of periodic cycles M is calculated as M=$f_t$/$f_{res}$. In step 320, it is determined whether the number of periodic cycles M is a whole odd number. If so, the procedure continues with step 324. Otherwise, M is adjusted to the nearest whole odd number. In step 324, the exact value for sample frequency is calculated: $f_s$=($f_t$×N)/M. If desired or necessary, the bandwidth is calculated as BW=$f_s$/2 in step 326.

In the present invention as illustrated in FIGS. 3A and 3B, one value is selected in step 300. This is the frequency of the signal generated by the signal generator 100. In addition, two approximate values are selected in steps 302 and 304. These are the sample frequency of the sampling circuit 104 and the number of samples extracted for testing purposes, respectively. Using the operations of the present invention as illustrated in FIGS. 3A, 3B and described above, the required number of samples is obtained in step 314, the required number of cycles is obtained in step 320 or 322, and the required sample frequency is obtained in step 324. Hence, given one value and two approximate values, all four required values are calculated for the testing procedure in one pass.

In another aspect of the present invention, sample frequency or bandwidth may be selected as exact values instead of the test frequency as described above. FIGS. 4A and 4B show process flowcharts for this situation. In step 400, a sample frequency $f_s$ or bandwidth BW is selected, which is a given value. In step 402, a test frequency $f_t$ is also selected. The $f_t$ value is an approximation and will be further adjusted, if necessary, to an exact value as described below. In step 404, a maximum frequency resolution max_$f_{res}$ is selected or, alternatively, a minimum number of samples min_N for running the test is selected. In step 406, the given sample frequency is calculated as $f_s$=BW×2. If the given sample frequency is used instead of bandwidth, then $f_s$ is set to $f_s$.

Further shown in FIG. 4A is an exponent EXP being calculated in step 408. If the maximum frequency resolution max_$f_{res}$ is used, then EXP is calculated as follows:

EXP=log($f_s$/max_$f_{res}$)/log(2.0)

Since min_N=$f_s$/max_$f_{res}$, the value for EXP may be alternatively calculated as follows:

EXP=log(min_N)/log(2.0)

In step 410, it is determined whether the exponent EXP is a whole number. If so, the procedure continues with step 414 in FIG. 4B. Otherwise, EXP is rounded up to the whole number in step 412, and the procedure continues with step 414 where the exact value for the number of samples is calculated as two to the power of the exponent: N=2⌃EXP. In step 416, the exact value for frequency resolution $f_{res}$ is calculated as $f_s$/N. Continuing with step 418, the number of periodic cycles M is calculated as M=$f_t$/$f_{res}$. In step 420, it is determined whether the number of periodic cycles M is a whole odd number. If so, the procedure continues with step 424. Otherwise, M is adjusted to the nearest whole odd number. In step 424, the exact value for test frequency is calculated: $f_t = M \times f_{res}$.

In accordance with another aspect of the present invention as illustrated in FIGS. 4A and 4B, one value is selected in step 400. This is the sample frequency (or bandwidth) of the sampling circuit 104. In addition, two approximate values are selected in steps 402 and 404. These are the test frequency of the signal generated by the signal generator 100 and the number of samples extracted for testing purposes, respectively. Using the operations of the present invention as illustrated in FIGS. 4A, 4B and described above, the required number of samples is obtained in step 414, the required number of cycles is obtained in step 420 or 422, and the required test frequency is obtained in step 424. Hence, given one value and two approximate values, all four required values are calculated for the testing procedure in one pass.

It is understood, of course, that the operations shown in FIGS. 3A, 3B, 4A, 4B and described above are carried out by the computer 108. In particular, a program code is stored on a computer-readable storage medium, and the program code is executed by a programmable controller or a microprocessor of the computer 108 to perform the operations according to the present invention.

Those skilled in the art will recognize from this disclosure that according to the present invention the non-iterative FFT coherency analysis algorithm establishes sample-set coherency for a "sample-sourced" or "sample-captured" IC signal.

Furthermore, the non-iterative FFT coherency analysis algorithm can be used outside the realm of testing ICs. If a system is built to sample-source or sample-capture varying frequencies in such a manner that the sample rate changes for the purposes of efficiency, etc., the non-iterative FFT coherency analysis algorithm can be used in real time to calculate the necessary 4 parameters, i.e., $f_t$, $f_s$, N and M.

While the invention has been described and illustrated in connection with preferred embodiments, many variations and modifications as will be evident to those skilled in this art may be made without departing from the spirit and scope of the invention, and the invention is thus not to be limited to the precise details of methodology or construction set forth above as such variations and modification are intended to be included within the scope of the invention.

What is claimed is:

1. A method for testing an integrated circuit (IC) device using an FFT algorithm supported by a non-iterative Fast Fourier Transform (FFT) coherency analysis algorithm to establish FFT sample-set coherency, comprising:

generating a test signal of a predetermined test frequency;

supplying said test signal to said IC device;

selecting a sample frequency for sampling said test signal which is output from said IC device;

selecting a number of samples from the sampled test signal; and selecting a number of periodic cycles over which the samples have been taken such that said predetermined test frequency, sample frequency, number of samples and number of periodic cycles are related to each other by a predetermined relationship;

wherein the number of samples is selected as an approximate value, and further comprising calculating the number of samples as an exact value which is equal to two raised to the power of an exponent, wherein said exponent is selectively chosen as a function of a desired maximum frequency resolution and said sample frequency or as a function of a desired minimum number of samples.

2. The method according to claim 1, wherein said exponent is rounded up to a whole number.

3. A system for testing an integrated circuit (IC) device using an FFT algorithm supported by a non-iterative Fast Fourier Transform (FFT) coherency analysis algorithm to establish FFT sample-set coherency, comprising:

means for generating a test signal of a predetermined test frequency;

means for supplying said test signal to said IC device;

means for selecting a sample frequency for sampling said test signal which is output from said IC device;

means for selecting a number of samples from the sampled test signal; and means for selecting a number of periodic cycles over which the samples have been taken such that said predetermined test frequency, sample frequency, number of samples and number of periodic cycles are related to each other by a predetermined relationship;

wherein the number of samples is selected as an approximate value, and further comprising means for calculating the number of samples as an exact value which is equal to two raised to the power of an exponent, wherein said exponent is selectively chosen as a function of a desired maximum frequency resolution and said sample frequency or as a function of a desired minimum number of samples.

4. The system according to claim 3, wherein said exponent is rounded up to a whole number.

* * * * *